US006255892B1

United States Patent

(12) United States Patent
Gärtner et al.
(10) Patent No.: US 6,255,892 B1
(45) Date of Patent: Jul. 3, 2001

(54) TEMPERATURE SENSOR

(75) Inventors: Manuel Gärtner, München; Helmut Hertrich, Vaterstetten, both of (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/392,271

(22) Filed: Sep. 9, 1999

(30) Foreign Application Priority Data

Sep. 9, 1998 (DE) ..................... 198 41 202

(51) Int. Cl.[7] ..................... H01L 35/00

(52) U.S. Cl. ..................... 327/512; 327/80

(58) Field of Search ..................... 27/77, 80, 81, 27/83, 87, 88, 89, 512, 513

(56) References Cited

U.S. PATENT DOCUMENTS

| | | | |
|---|---|---|---|
| 4,267,468 * | 5/1981 | Hilliker | 307/310 |
| 4,331,888 | 5/1982 | Yamauchi | 340/598 |
| 5,336,943 | 8/1994 | Kelly et al. | 307/310 |
| 5,918,982 * | 7/1999 | Nagata et al. | 374/178 |
| 6,084,462 * | 7/2000 | Barker | 327/512 |

FOREIGN PATENT DOCUMENTS

4437461A1 4/1996 (DE) .

OTHER PUBLICATIONS

Patent Abstracts of Japan, 58–208631, (Hashimoto), dated Dec. 5, 1983.

* cited by examiner

*Primary Examiner*—Jeffrey Zweizig
(74) *Attorney, Agent, or Firm*—Herbert L. Lerner; Laurence A. Greenberg; Werner H. Stemer

(57) ABSTRACT

The temperature sensor measures temperatures within a defined temperature measuring range. The sensor includes a reference voltage source with an output terminal to which a reference voltage is applied and which is connected to a first input terminal of a comparator. A series circuit of a semiconductor component with temperature-independent current characteristic and a reference component is connected between a first and a second supply voltage terminal. A temperature-dependent voltage is applied to a node common to the semiconductor component and the reference component. The temperature-dependent voltage is fed to a second input terminal of the comparator. The supply voltage is adjustable within a defined supply voltage range and, within a voltage range resulting from the supply voltage range of a voltage across the reference component, the reference component has a voltage-dependent current characteristic.

11 Claims, 3 Drawing Sheets

LTR
VGate
T6
D
S
4
OUT
K
EK2
EK1
U1
U2
R
I1
I2
DD
T3
T4
5
AK
T1
T2
UR
GND
Vbb
2
1
6
3

TEMPERATURE SENSOR

BACKGROUND OF THE INVENTION

Field of the Invention

The invention pertains to a temperature sensor for measuring temperatures within a defined temperature measuring range. The sensor has the following features:

- a reference voltage source for providing a reference voltage at an output terminal which is connected to a first input terminal of a comparator;
- a series circuit of a measuring element and a reference component connected between a first and a second supply terminal, whereby a temperature-dependent voltage is applied to a node common to the semiconductor component and the reference component and is applied to a second input terminal of the comparator.

Such kinds of temperature sensors, in particular those fabricated in an integrated way, are used for switching, especially for switching off loads if a specified temperature is exceeded. For this purpose the temperature-dependent voltage and the reference voltage are compared through a comparing element usually realized as a comparator, whereby one of two different voltage levels is applied to the output of the comparator depending on whether or not the temperature-dependent voltage is higher than the reference voltage.

A temperature sensor of this kind is known from the commonly assigned invention described in German published patent application DE 44 37 461 A1. The reference voltage source is thereby formed as a series circuit between a first supply terminal and a second supply terminal. The series circuit has a depletion-mode FET wired up as a current source and an enhancement-mode FET wired up as a diode. A node common to the depletion-mode FET and the enhancement-mode FET is thereby connected as the reference voltage output to a first input terminal of the comparator. The two transistors in that prior art temperature sensor are dimensioned such that the reference voltage remains constant within the temperature range to be measured, or increases with increasing temperature. The reference component in the known temperature sensor is realized as a depletion-mode FET which is wired up as a current source. The measuring element connected in series with the reference component has a temperature-dependent current characteristic and is formed as a series circuit of two enhancement-mode FETS, each of which is wired up as a diode. A node common to the depletion-mode FET and the series circuit of the enhancement-mode FET is connected to a second input of the comparator, whereby the depletion-mode FET serving as reference component and the enhancement-mode FET connected in series thereto are tuned to each other such that the potential applied to this node decreases with increasing temperature in order to cause a change of the voltage level at the output of the comparator in the event that this potential falls below the reference voltage delivered by the reference voltage source.

In the prior art temperature sensor, the switching temperature, i.e. the temperature at which the temperature-dependent voltage attains the value of the reference voltage, is defined exclusively through the dimensioning of the components.

SUMMARY OF THE INVENTION

It is accordingly an object of the invention to provide a temperature sensor, which overcomes the above-mentioned disadvantages of the heretofore-known devices and methods of this general type and which provides for a switching temperature that is adjustable.

With the foregoing and other objects in view there is provided, in accordance with the invention, a temperature sensor for measuring temperatures within a defined temperature measuring range, comprising:

a reference voltage source with an output terminal receiving a reference voltage;

a comparing element with a first input terminal connected to the reference voltage source, and a second input terminal;

first and second supply terminals carrying a supply voltage adjustable within a defined supply voltage range;

a series circuit of a measuring element and a reference component connected between the first and second supply terminals, whereby a node common to the measuring element and the reference component receives a temperature-dependent voltage and is connected with the second input terminal of the comparing element; and the reference component having a voltage-dependent current characteristic within a voltage range of a voltage across the reference component determined by the defined supply voltage range.

In other words, the objects of the invention are satisfied in that the supply voltage applied between the supply terminals is adjustable within a defined range and the reference component has a voltage-dependent current characteristic within a voltage range of a voltage arising across the reference component as a result of the above adjustable supply voltage. The reference component delivers to the semiconductor component a current that is dependent on this voltage.

If the supply voltage at the temperature sensor according to the invention changes, a voltage arising across the reference component also changes, causing a change in the current flow through the reference component as a result of the voltage-dependent current characteristic of the reference component. This change in the current through the reference component causes a change in the voltage across the semiconductor component connected in series to the reference component and with temperature-dependent current characteristic, and thereby at the node common to the reference component and the semiconductor component. The voltage applied to this common node is therefore dependent on the supply current as well as on the temperature. As a result there are different temperatures for different values of the supply voltage, at which temperatures the voltage at the common node between the semiconductor component and the reference component, or at the second input terminal of the comparator, exceeds or is smaller than the value of the reference voltage supplied by the reference voltage source. In this respect the reference voltage source is preferably dimensioned such that it supplies a constant reference voltage both over the temperature measurement range and over the supply voltage range. The switching temperatures for the temperature sensor according to the invention are thus dependent on the supply voltage as well as on the dimensioning of the components used.

In accordance with an added feature of the invention, the reference component is an ohmic resistor.

In accordance with an additional feature of the invention, the reference component is a thick oxide depletion-mode transistor.

For both ohmic resistors and so-called thick oxide depletion-mode transistors the current flowing through the component increases with the voltage applied across the component. In the case of ohmic resistors this applies for almost any voltage and the thick oxide depletion-mode transistors for use in the temperature sensor according to the invention are so dimensioned that their drain current within the variable supply voltage range is voltage-dependent and, in particular, increases with increasing supply voltage.

In accordance with another feature of the invention, the semiconductor component with the temperature-dependent current characteristic is a diode.

In a preferred embodiment of the invention, the diode is a MOS diode, i.e. it is a MOS transistor wired up as a diode.

In accordance with a further feature of the invention, the measuring element is a series circuit of at least two MOS transistors each wired up as a diode.

In this context, the term "temperature-dependent current characteristic" means that for a specific voltage applied across the component the current flowing through the component depends on the temperature.

In accordance with again an added feature of the invention, a reference voltage at the output terminal of the reference voltage source is temperature-independent within the temperature measuring range and is independent of the supply voltage within the defined supply voltage range.

In accordance with again another feature of the invention, the reference voltage source is connected between the first and second supply terminals and comprises a series circuit of a depletion-mode FET wired up as a current source and an enhancement-mode FET wired up as a diode, and wherein a node common to the depletion-mode FET and the enhancement-mode FET is connected to the output terminal.

In accordance with again an additional feature of the invention, the depletion-mode FET and the enhancement-mode FET are tuned to each other such that a voltage arising across the enhancement-mode FET does not increase within the temperature measuring range.

In accordance with a concomitant feature of the invention, the comparing element is a differential amplifier or a comparator.

In summary, the reference voltage source is preferably constructed such that an essentially temperature-independent reference voltage is applied to the output terminal connected with the first input terminal of the comparator. The reference voltage source is preferably formed as a series circuit of a depletion-mode FET wired as a current source and an enhancement-mode FET wired as a diode, whereby the output terminal is connected to a node common to the depletion-mode FET and the enhancement-mode FET and the series circuit is connected between the first and the second supply terminal. The two transistors are also tuned to each other such that the voltage arising across the load path of the enhancement-mode FET is essentially constant for the temperature range to be measured. In this connection advantage is taken of the fact that the drain current of the depletion-mode FET wired as current source decreases with increasing temperature and the enhancement-mode FET is drivable at operating points in which the drain-source voltage increases with increasing temperature. The depletion-mode FET is also dimensioned such that the drain current is essentially independent of supply voltage fluctuations within the supply voltage range. The reference voltage source therefore supplies at the output terminal a reference voltage which is essentially independent of both temperature and supply voltage.

Other features which are considered as characteristic for the invention are set forth in the appended claims.

Although the invention is illustrated and described herein as embodied in a temperature sensor, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
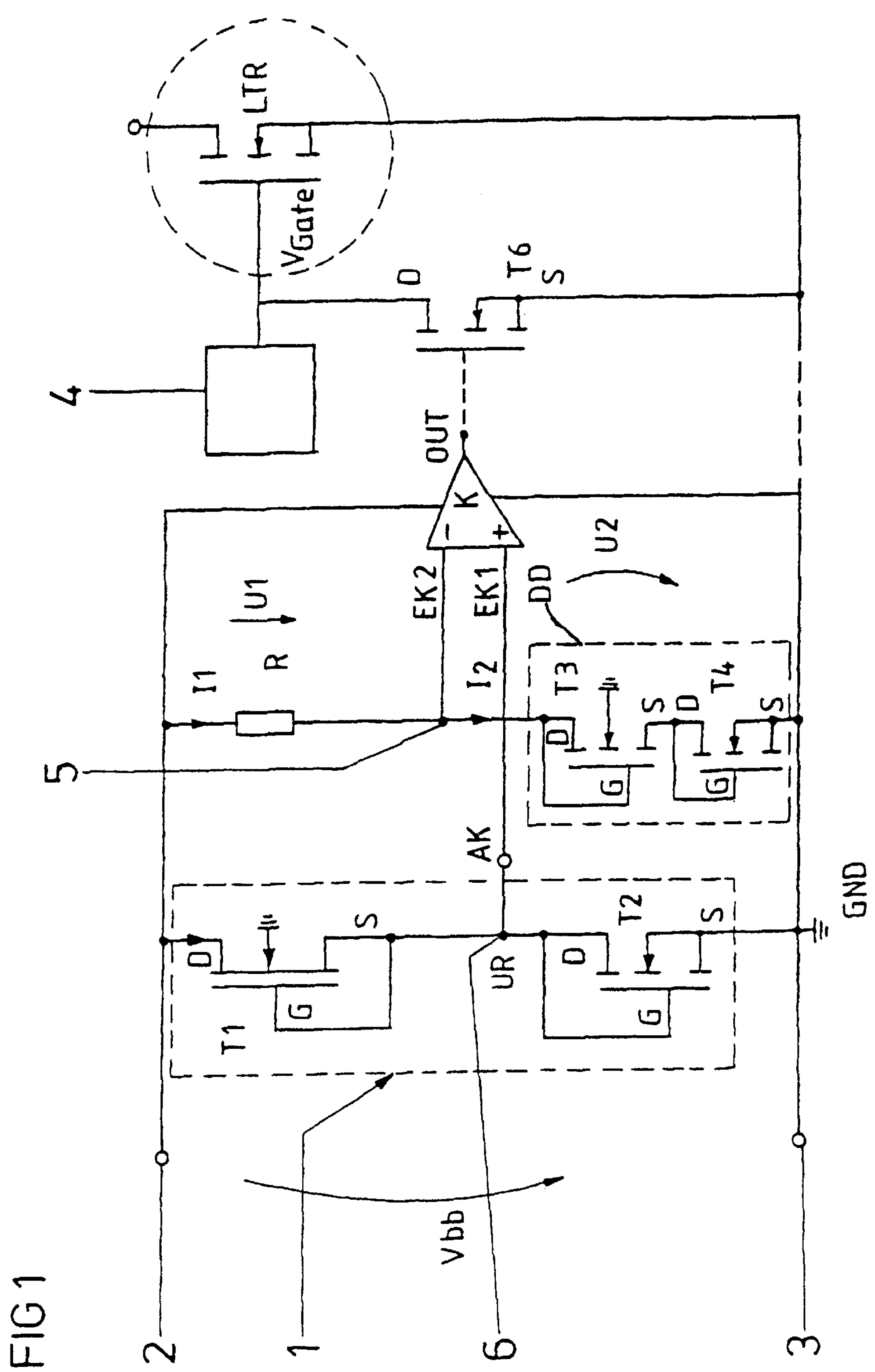
FIG. 1 is a circuit schematic of an embodiment of the temperature sensor according to the invention.

Unless specifically noted, the same reference symbols in the drawing figures relate to identical or functionally identical components throughout.

Referring now to the figures of the drawing in detail and first, particularly, to FIG. 1 thereof, there is seen an embodiment of a temperature sensor according to the invention for measuring temperatures within a defined temperature measurement range. The temperature sensor has a reference voltage source 1 with an output terminal AK which is connected to a first input terminal EK1 of a comparator K. The reference voltage source 1 is realized as series circuit of a depletion-mode FET T1 with an enhancement-mode FET T2 and is formed between a first and a second supply terminal 2, 3, between which exists a supply voltage Vbb. The depletion-mode FET T1 is thereby wired up as a current source and the enhancement-mode FET T2 is wired up as a diode, i.e. the gate electrode G of the depletion-mode FET T1 is connected with its source electrode S and the gate electrode G of the enhancement-mode FET T2 is connected with its drain electrode D. The substrate connections of the two transistors T1, T2 lie at the potential of the second supply terminal 3, which is preferably at ground potential GND.

A node 6 common to the depletion-mode FET T1 and the enhancement-mode FET T2 is connected to the output terminal AK and therewith to the first input terminal EK1 of the comparing element K. The depletion-mode FET T1 has the characteristic that its drain current is approximately constant over wide ranges of a voltage U3 applied across the load path Drain-to-Source. Therefore for a defined temperature within the temperature measuring range, fluctuations in the supply voltage Vbb do not cause changes in the drain current through the depletion-mode FET T1 and the drain current through the enhancement-mode FET T2. The reference voltage source illustrated is therefore largely supply voltage independent and in the supply voltage range within which the supply voltage can vary, supplies an at least approximately constant reference voltage UR to the output terminal AK. The FETs T1 and T2 of the reference voltage source 1 are preferably dimensioned such that their drain-source voltage drops are independent of temperature in the temperature measuring range.

A series circuit of a reference component and a measuring element with temperature-dependent current characteristic is connected between the supply terminals 2,3 in parallel to the reference voltage source 1. The reference component in this case is realized as ohmic resistor R and the measuring element as MOS diode DD. A node 5 common to the ohmic resistor R and the MOS diode DD is connected to a second input terminal EK2 of the comparing element K. As explained below, a temperature-dependent voltage U2 is applied to the node 5.

The comparing element K is preferably realized as differential amplifier or comparator. If a comparator is used, the output OUT of the comparator K lies at one of two distinguishable voltage levels depending on whether the voltage U2 is greater or smaller than the reference voltage UR. Depending on which voltage level is being applied to the output OUT of the comparator K, a transistor T6 connected in series with the comparator K is controlled, over the load path D-S of which transistor T6 a gate electrode of a load transistor LTR is controlled in order to regulate the load transistor LTR. The output level of the comparator K changes if the voltage U2 becomes greater or less than the reference voltage UR. The temperature at which the voltage U2 takes on the value of the reference voltage UR is designated as the switching temperature.

Whereas the use of a comparator as comparing element K means that the load transistor LTR functions as a switch dependent on whether the measured temperature becomes greater or less than the switching temperature, the use of a differential amplifier as comparing element K offers the possibility of reducing the conductivity of the load transistor LTR with increasing temperature, in order to reduce the load current and therewith the temperature. The output OUT of the comparing element realized as a differential amplifier is dependent on the difference between the voltage U2 and the reference voltage UR.

If the difference becomes smaller, i.e. the temperature increases and therewith the voltage U2, the voltage applied to the output OUT increases in order to reduce the conductivity of the transistor T6 and therewith the conductivity of the load transistor and the load current.

This enables the current flowing through the load transistor to be subjected to analog control dependent on the temperature.

In the temperature sensor according to the invention this switching temperature is dependent on the supply voltage Vbb as well as on the dimensioning of the components already described. This connection is explained in the following with reference to FIGS. 2 to 5.

Figure 2:
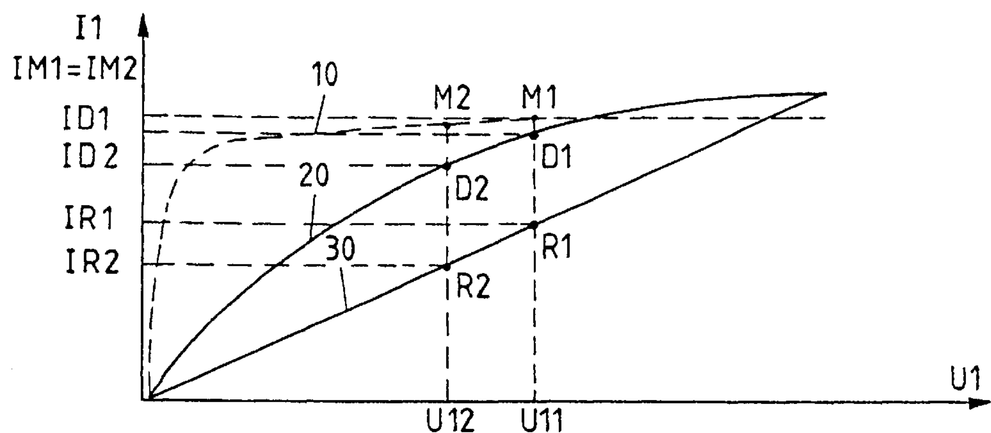
FIG. 2 is a graph showing a current characteristics of an ohmic resistor and a thick oxide depletion-mode FET as reference components.

FIG. 2 shows the current characteristic of the reference component. For this purpose the current I1 for different reference components is plotted against the voltage U1 applied to the reference component. Curve 30 shows the current characteristic of an ohmic resistor, for which the current I1 is proportional to the voltage U1. In curve 20, the current characteristic is plotted for a thick oxide depletion-mode FET for which the current initially climbs steeply starting from U1=0 and then increases more slowly. Thus both a thick oxide depletion-mode FET and an ohmic resistor are suitable as a reference component with voltage-dependent current characteristic. When using a thick oxide depletion-mode FET care must be taken that this is dimensioned such that a voltage U1 arising across the thick oxide depletion-mode FET through fluctuations in the supply voltage Vbb does not lead to saturation of the depletion-mode FET, i.e. that the current I1 continues to increase with increasing voltage U1.

For comparison, the output characteristic of a depletion-mode FET wired up as a current source is drawn in FIG. 2 as curve 10, in which the current I1 initially climbs rapidly with increasing voltage U1 and then remains essentially independent of further increases in the voltage.

For the use in the reference voltage source 1 of a depletion-mode FET T1 wired up as current source, this means that for a wide range of the voltage arising across it, the depletion-mode FET causes an approximately constant current through the series circuit of depletion-mode FET T1 and enhancement-mode FET T2. Thus the depletion-mode FET T1 wired up as current source makes the reference voltage source 1 largely independent of fluctuations in the supply voltage Vbb.

In FIG. 2 the operating points R1, R2 of an ohmic resistor as reference component and the operating points D1, D2 of a thick oxide depletion-mode FET as reference component are plotted respectively for two different voltages U11, U12. The currents IR1, IR2 and ID1, ID2 flowing through the reference components at the individual operating points demonstrate that the current flowing through the reference component increases with increasing voltage. As a comparison, an essentially equal current arises for two operating points M1, M2 of a depletion-mode FET.

Figure 3:
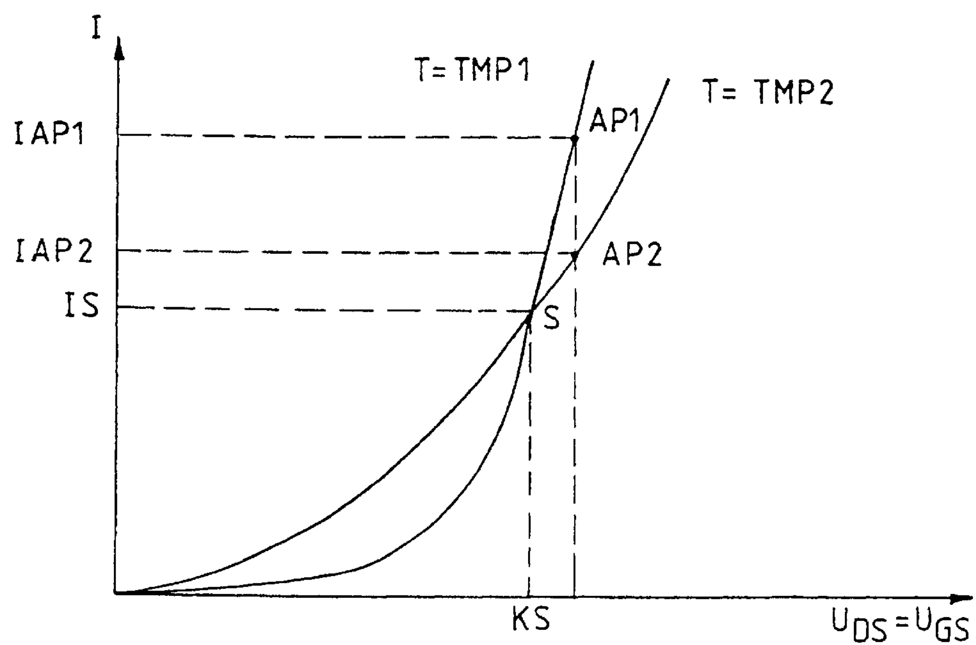
FIG. 3 is a graph showing a temperature-dependent current characteristic of a MOS diode.

FIG. 3 shows the current characteristic of a MOS diode DD realized as an enhancement-mode FET, the gate electrode of which is connected with the drain electrode—i.e. in which the drain-source voltage UDS is equal to the gate-source voltage $U_{GS}$. The characteristic curve for the MOS diode DD is illustrated for two different temperatures TMP1 and TMP2, where TMP2>TMP1. The characteristic curves of the MOS diode DD for different temperatures TMP1 and TMP2 intersect at a common operating point S, at which the drain current IS flowing through the MOS diode, or the drain-source voltage US arising across the MOS diode, is independent of temperature. For operating points above the operating point S, i.e. for currents I>IS, the output voltage increases with increasing temperature whereas it decreases with increasing temperature for operating points below the operating point S. For operating points AP1 and AP2 above the operating point S the drain-source voltage $U_{DS}$ of the MOS diode remains constant if the drain current I is reduced with increasing temperature from the value IAP1 to the value IAP2. This can be achieved through a temperature-dependent current source in series with the MOS diode, as shown in FIG. 1 for the reference voltage source 1, in which a depletion-mode FET T1 wired up as current source serves as current source. The current through the depletion-mode FET T1 is temperature-dependent and decreases with increasing temperature.

The depletion-mode FET T1 and the enhancement-mode FET T2 of the reference voltage source 1 can be tuned to each other such that for the temperature range to be measured only such operating points of the enhancement-mode FET T2 arise at which the drain-source voltage is at least approximately constant so as to generate a reference voltage UR which is at least approximately constant.

Figure 4:
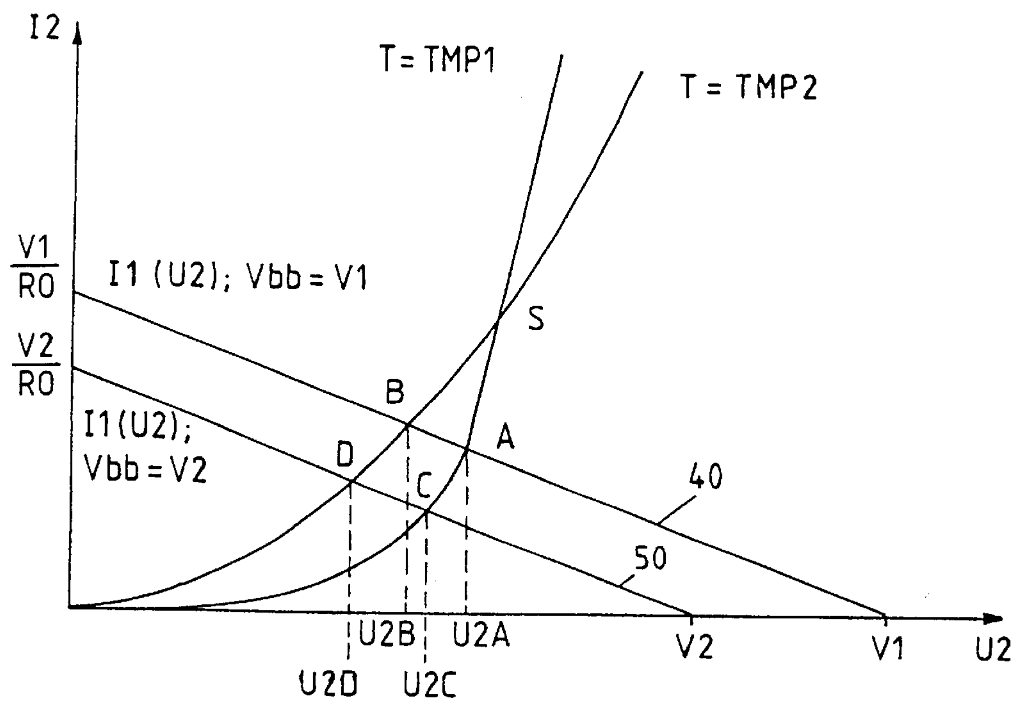
FIG. 4 is a graph of the derivation of a voltage applied to the node common to reference component and semiconductor component on the basis of the current characteristic of a reference component realized as an ohmic resistor and of a semiconductor component realized as a MOS diode, for different supply voltages and different temperatures.

The voltage U2 arising at the second input terminal EK2 of the comparator K is derived in the following for different temperatures and different supply voltages and these examples are illustrated in FIG. 4. For this purpose the characteristic curves of the MOS diode for different temperatures TMP1, TMP2, as known from FIG. 3, are first plotted. An ohmic resistor R of value R0 is assumed as reference component. The current I2 flowing through the MOS diode DD must also flow through the ohmic resistor R, whereby the supply voltage Vbb is derived as the sum of the voltage U1 arising across the ohmic resistor and the voltage U2 arising across the MOS diode DD. Taking this into account, the two curves labeled 40 and 50 in FIG. 4 are derived for the current I1 through the ohmic resistor R in dependence on the voltage U2 arising across the MOS diode DD for different supply voltages V1 and V2. The points of intersection of these curves 40, 50 with the characteristic curves of the MOS diode DD thereby represent the operating points A, B, C, D of the MOS diode DD for different supply voltages Vbb=U1, Vbb=U2 and temperatures T=TMP1, T=TMP2. In this connection the supply voltage range and the value R0 of the resistor are selected such that the operating points of the MOS diode arising for the temperatures to be measured lie below the operating point S so that the voltage U2 decreases with increasing temperature. At the operating points A, B, C, D of the MOS diode DD a voltage U2=U2A arises for a supply voltage Vbb=V1 and a temperature T=TMP1, a voltage U2=U2B for a supply voltage Vbb=V1 and a temperature T=TMP2, a voltage U2=U2C for a supply voltage Vbb=V2 and a temperature T=TMP1 and a voltage U2=U2D for a supply voltage Vbb=V2 and a temperature T=TMP2. As is clear from FIG. 4, the voltage U2 arising at the second input terminal EK2 of the comparator K depends both on the temperature and on the supply voltage Vbb. For the exemplary embodiment illustrated, this voltage decreases, on the one hand, with increasing temperature and, on the other, with decreasing supply voltage.

Figure 5:
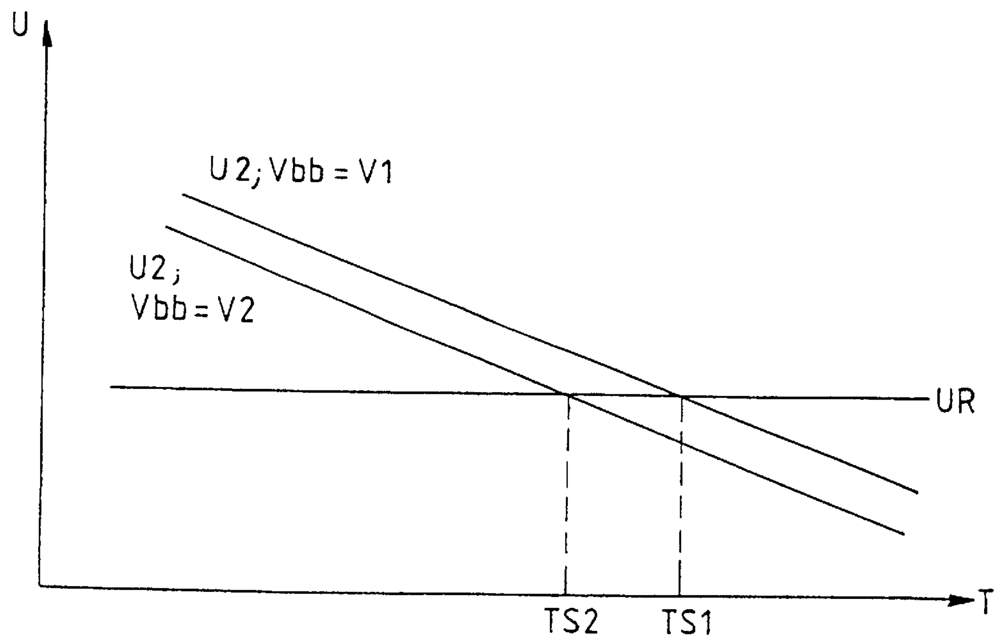
FIG. 5 is a graph showing the dependence of the switching temperature on the supply voltage.

FIG. 5 shows how the voltage U2 varies depending on the temperature T for two different supply voltages Vbb=V1 and Vbb=V2, the diagram being obtained through determining and plotting the voltages arising for the two different supply voltages at a number of different temperatures, e.g. using a graph according to FIG. 4. The value of the reference voltage UR, which is assumed to be constant in the relevant range, is also plotted in FIG. 5. The curve for the voltage U2 at Vbb=V1 is labeled 60 in FIG. 5 and the curve for U2 at Vbb=V2 is labeled 70. The points at which the curves 60, 70 intersect the curve for the reference voltage UR are designated as switching temperatures, whereby it can be seen from FIG. 5 that these switching temperatures are dependent on the supply voltage Vbb. For the exemplary embodiments given, the switching temperatures decrease with decreasing supply voltage. For a supply voltage Vbb=V2 a switching temperature TS2 arises which is smaller than a switching temperature TS1 for a supply voltage Vbb=V1.

The MOS diode DD is preferably realized as a series circuit of a second enhancement-mode FET T3 with a third enhancement-mode FET T4, each of which is wired up as a diode. For this purpose the gate electrodes of the enhancement-mode FETs T3, T4 are connected with their drain electrodes.

The temperature sensor according to the invention, which is preferably realized as an integrated circuit, enables a single component to be used for both measurement of temperature and for adjustment of the switching temperature by means of the supply voltage.

We claim:

1. A temperature sensor for measuring temperatures within a defined temperature measuring range, comprising:

a reference voltage source with an output terminal receiving a reference voltage;

a comparing element with a first input terminal connected to said reference voltage source, and a second input terminal;

first and second supply terminals carrying a supply voltage adjustable within a defined supply voltage range;

a series circuit of a measuring element and a reference component connected between said first and second supply terminals, whereby a node common to said measuring element and said reference component receives a temperature-dependent voltage and is connected with said second input terminal of said comparing element; and said reference component having a voltage-dependent current characteristic within a voltage range of a voltage across the reference component determined by the defined supply voltage range.

2. The temperature sensor according to claim 1, wherein said reference component is an ohmic resistor.

3. The temperature sensor according to claim 1, wherein said reference component is a thick oxide depletion-mode transistor.

4. The temperature sensor according to claim 1, wherein said measuring element is a diode.

5. The temperature sensor according to claim 1, wherein said measuring element is a MOS transistor wired up as a diode.

6. The temperature sensor according to claim 1, wherein said measuring element is a series circuit of at least two MOS transistors each wired up as a diode.

7. The temperature sensor according to claim 1, wherein a reference voltage at said output terminal of said reference voltage source is temperature-independent within the temperature measuring range and is independent of the supply voltage within the defined supply voltage range.

8. The temperature sensor according to claim 1, wherein said reference voltage source is connected between said first and second supply terminals and comprises a series circuit of a depletion-mode FET wired up as a current source and an enhancement-mode FET wired up as a diode, and wherein a node common to said depletion-mode FET and said enhancement-mode FET is connected to said output terminal.

9. The temperature sensor according to claim 8, wherein said depletion-mode FET and said enhancement-mode FET are tuned to each other such that a voltage arising across said enhancement-mode FET does not increase within the temperature measuring range.

10. The temperature sensor according to claim 1, wherein said comparing element is a differential amplifier.

11. The temperature sensor according to claim 1, wherein said comparing element is a comparator.

* * * * *